United States Patent
Juang

(10) Patent No.: US 7,627,443 B2
(45) Date of Patent: Dec. 1, 2009

(54) CALIBRATION APPARATUS AND METHOD FOR PROGRAMMABLE RESPONSE FREQUENCY SELECTING ELEMENTS

(75) Inventor: Kai-Cheung Juang, Nantou (TW)

(73) Assignee: Industrial Technology Research Institute, Hsinchu (TW)

( * ) Notice: Subject to any disclaimer, the term of this patent is extended or adjusted under 35 U.S.C. 154(b) by 151 days.

(21) Appl. No.: 11/761,365

(22) Filed: Jun. 11, 2007

(65) Prior Publication Data

US 2008/0191796 A1  Aug. 14, 2008

(30) Foreign Application Priority Data

Feb. 12, 2007  (TW) ............... 96105134 A

(51) Int. Cl.
*G01R 19/00* (2006.01)
(52) U.S. Cl. ..................................... 702/64
(58) Field of Classification Search .......... 702/64; 327/553; 375/327; 27/553
See application file for complete search history.

(56) References Cited

U.S. PATENT DOCUMENTS 6,574,288 B1 * 6/2003 Welland et al. ............. 375/327
2005/0189951 A1   9/2005 Ibrahim et al. ............. 324/616
2005/0242871 A1  11/2005 Wang ......................... 327/552
2006/0049899 A1   3/2006 De Ruijter .................. 333/215
2008/0191795 A1 * 8/2008 Dharmalinggam et al. .. 327/553

* cited by examiner

*Primary Examiner*—Tung S Lau
*Assistant Examiner*—Xiuquin Sun

(57) ABSTRACT

Disclosed is a calibration apparatus and method for programmable response frequency selecting elements. The calibration apparatus comprises a basic reference source, a programmable counter, a control logic unit, and a frequency to time constant converter. The programmable counter generates plural different frequency signals required by the frequency selecting elements with different frequency responses. The frequency to time constant converter determines a calibrated capacitance through the timing control signals generated by the control logic unit. This invention makes the process, temperature, and power supply variation for frequency selecting elements free. It allows the frequency selecting elements to have a high accurate, stable, and wide range programming of frequency responses. It is suitable for multi-standard applications. It greatly reduces the chip size, and significantly lowers down the cost for the applications.

12 Claims, 9 Drawing Sheets

CALIBRATION APPARATUS AND METHOD FOR PROGRAMMABLE RESPONSE FREQUENCY SELECTING ELEMENTS

FIELD OF THE INVENTION

The present invention generally relates to a calibration apparatus and method for programmable response frequency selecting elements.

BACKGROUND OF THE INVENTION

The frequency selecting element is an important component in the electronic industry. The general wireless communication system uses different frequencies, and frequency selecting elements of different specifications. For example, the filter in the wireless communication receiver is for filtering out the interfering frequencies so as to relax the restriction on the signal dynamic range of the circuit, and the circuit can be implemented to a low power consumption and low cost specification. Furthermore, the communication quality can be improved by filtering out the interference signals, thereby increasing the signal-to-noise ratio (SNR). In addition to communication systems, the filters of various specifications and types are also used in consumer electronic products. In all these applications, it is important for the filter to be able to precisely select the frequency.

The main function of a filter is to select the frequency on the frequency spectrum. Therefore, the filter usually includes frequency selecting elements, such as inductor and capacitor. FIG. 1A shows a typical RC circuit, which is a main component of a low pass filter. The relation between the output voltage Vout and input voltage Vin is $$Vout = \frac{1}{sCR+1} Vin.$$

FIG. 1B shows a typical LC circuit, which is also a main component of a low pass filter. The relation between the output voltage Vout and input voltage Vin is $$Vout = \frac{1}{s^2 LC+1} Vin.$$

The output voltage Vout of the RC circuit and the LC circuit forms the low pass response with respect to the input voltage Vin, as shown in FIG. 1C, where the x-axis is the frequency, and the y-axis is the ratio of the Vout versus Vin. The frequency selectable characteristic is the core of the filter component.

When the filter is realized in an IC, the inductor and the resistor of FIGS. 1A & 1B will be substituted by other means because of the operating frequency and the operating characteristics.

FIG. 2A shows the use of an operation amplifier 203 to implement a higher order filter in an RC filter. The operation amplifier can serve the purpose of isolation and buffering in a high order system, simplifies the design and improves the performance. However, it is hard for the operation amplifier to have a sufficient bandwidth.

FIG. 2B shows a transadmittance filter. As shown in FIG. 2B, the transadmittance filter uses a transconductor 205 to convert the voltage signals, Vin and Vin_, into current signals, to charge and discharge the capacitor C, then to convert into output voltage signal Vout. This forms the frequency selection mechanism. The transadmittance filter can compensate for the problems of higher operating frequency and 20 insufficient bandwidth encountered by the operation amplifier 203 of FIG. 2A.

FIG. 2C shows a switch capacitor filter. The filter uses two switches 207, 208 for switching between capacitors C1, C2, and controlling the charging and discharging to form the frequency selection mechanism. The frequency selection precision is good, but this design is a discrete time type and subjected to additional noise and interference. In addition, this type of filter must be used together with other circuit component, and cannot be used in all systems.

In contrast to the switch capacitor filter being a discrete time filter, the RC filter and the transadmittance filter are both continuous time filters.

FIG. 3A shows a response figure of a typical low pass filter, where the x-axis is the frequency and the y-axis is the output voltage. As shown in FIG. 3A, the cut-off frequency is about 250 MHz. The cut-off frequency is an important design parameter for the filter. When the cut-off frequency is too high, the filter is unable to filter out the unwanted noise or interference signals outside of the operation bandwidth; thus, the SNR is reduced and the communication quality is poor. On the other hand, when the cut-off frequency is too low, a part of the operation bandwidth will be cut off; thus, the system may not function normally. In other words, the frequency response precision of a filter will greatly affect the operation of the system.

The variation of the manufacture parameter is inevitable in the IC design. With the variation of temperature and the power supply voltage, the characteristic variation will be even greater. FIG. 3B shows the frequency response variation of the filter caused by the manufacturing variation. As shown in FIG. 3B, the filter is designed to have a cut-off frequency at 250 MHz in an ideal manufacturing process 301. However, the process, temperature, and DC power supply variations make the frequency response to generate too high or too low variation, shown as the frequency response curves 303, 305, respectively.

If no compensation mechanism is added to the filter, the distortion in the frequency response will lead to the malfunction of the system, or poor performance. Therefore, the continuous time filter requires a compensation mechanism. The discrete time filter is usually immune to the variations; therefore, no additional compensation mechanism is required. But, the discrete time filter is not applicable to all types of systems.

Among the current wireless communication systems, the multi-standard communication systems are widely used, for example, 3G and 2G, or 2G and WiFi dual-standard systems. FIG. 4 shows a system block diagram of a dual-standard RF sub-system. As shown in FIG. 4, the RF front-end circuit includes three RF elements of different operation frequencies, i.e., GSM900 channel, DSC/PCS channel, and CDMA2000 channel. The RF sub-system includes large-area channel filters 401, 402. Channel filter 401 is the filter for GSM900 channel and DSC/PCS channel, with the cut-off frequency at 150 KHz. Channel filter 402 is for CDMA2000 channel, with the cut-off frequency at 600 KHz. To integrate the GSM/DSC and CDMA2000 wireless communication modules, the system must use different filters 401, 402. This type of design does not only require a larger chip area, but also raises the manufacturing cost.

SUMMARY OF THE INVENTION

The examples of the present invention may provide a calibration apparatus and method for programmable response frequency selecting elements. In the multi-standard application, the present invention may provide a high calibration range for frequency response. The present invention may also provide the frequency selecting elements to overcome the process, temperature and power supply voltage variations. The present invention is also applicable to other time constant or frequency selecting related elements for precision calibration and programmability.

The calibration apparatus for programmable response frequency selecting elements of the present invention includes a basic reference source, a programmable counter, a control logic unit and a frequency to time constant converter. The frequency to time constant converter further includes a set of capacitors.

According to the present invention, the calibration apparatus for programmable response frequency selecting elements uses the fixed frequency reference source of the electronic system as the reference source. Therefore, no additional system cost will incur, and the system can have a precise time reference source. The programmable counter generates a plurality of reference sources required by frequency selecting elements with different frequency response in accordance with the different specifications of frequency selecting elements and fixed frequency reference source inputted from the system processor. This accomplishes the frequency response programmability for the frequency selecting elements.

The frequency to time constant converter further includes a transconductor and switching element, a set of capacitors, a comparator, and a tuning logic unit. According to an input voltage, the frequency to time constant converter charges and discharges the set of capacitors sequentially, then, uses a plurality of timing control signals from the control logic unit to compare the voltage of the capacitors with a reference voltage. After the comparison, a calibrated capacitance is determined and recorded in the tuning logic unit.

The calibrated capacitance may be directly outputted to the capacitor set of the main frequency selecting elements; therefore, the frequency calibration and response tuning for the frequency selecting elements is accomplished.

Accordingly, the calibration apparatus for programmable response frequency selecting elements of the present invention enables the frequency selecting elements with precise frequency selecting capability, and maintains the design specification in spite of the variations on process, temperature and power supply. The present invention is applicable to the multi-standard systems to reduce the chip area and the cost. The present invention provides the frequency selecting elements with a digital interface to configure the response of the frequency selecting element so that the frequency selecting element may input different frequency response for multi-standard applications.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1A:
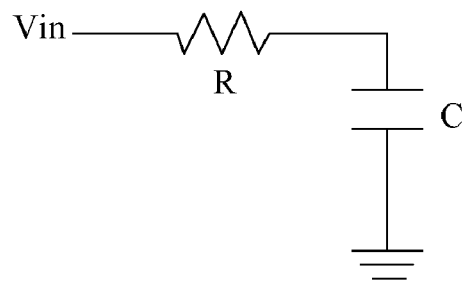
FIG. 1A shows a typical RC circuit.
Figure 1B:
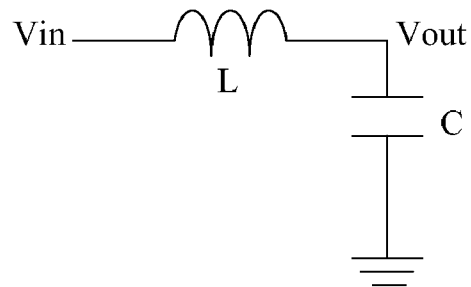
FIG. 1B shows a typical LC circuit.
Figure 1C:
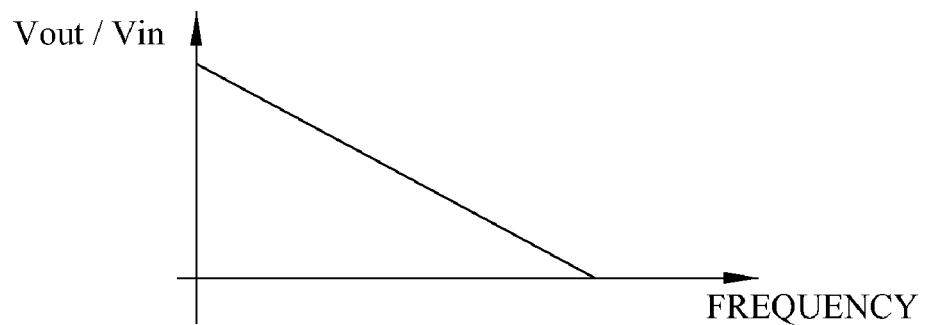
FIG. 1C shows a schematic view of a low pass response for an output voltage versus an input voltage.
Figure 2A:
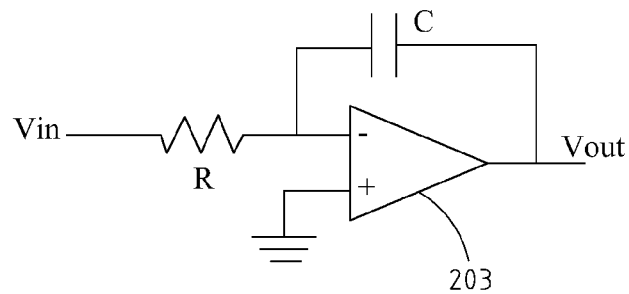
FIG. 2A shows the application of operation amplifier to implement a high order filter in an RC filter.
Figure 2B:
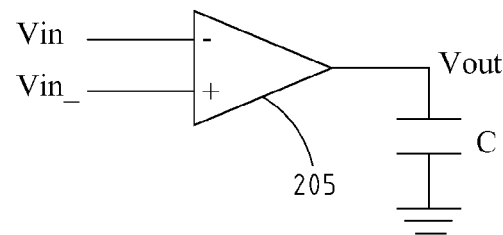
FIG. 2B shows a schematic view of a transadmittance filter with a transconductor.
Figure 2C:
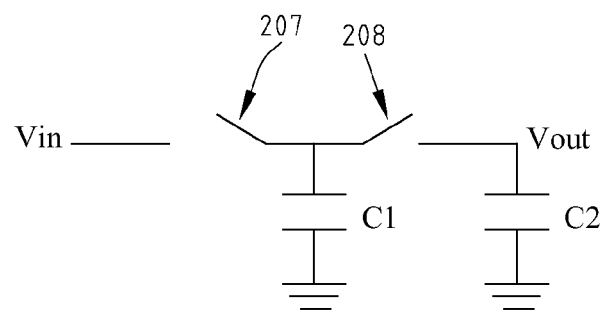
FIG. 2C shows a schematic view of a switching capacitor filter.
Figure 3A:
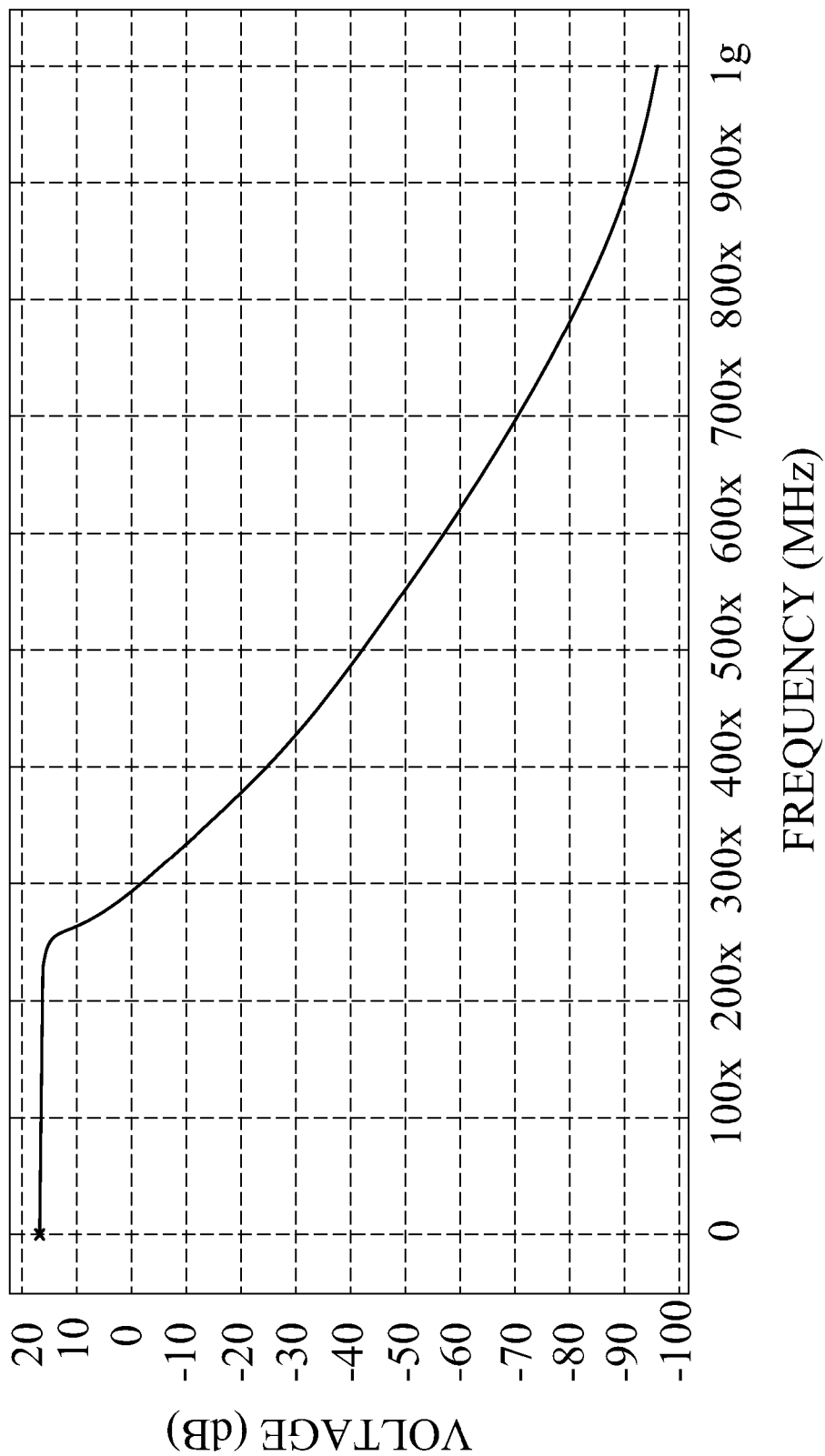
FIG. 3A shows a response figure of a typical low pass filter.
Figure 3B:
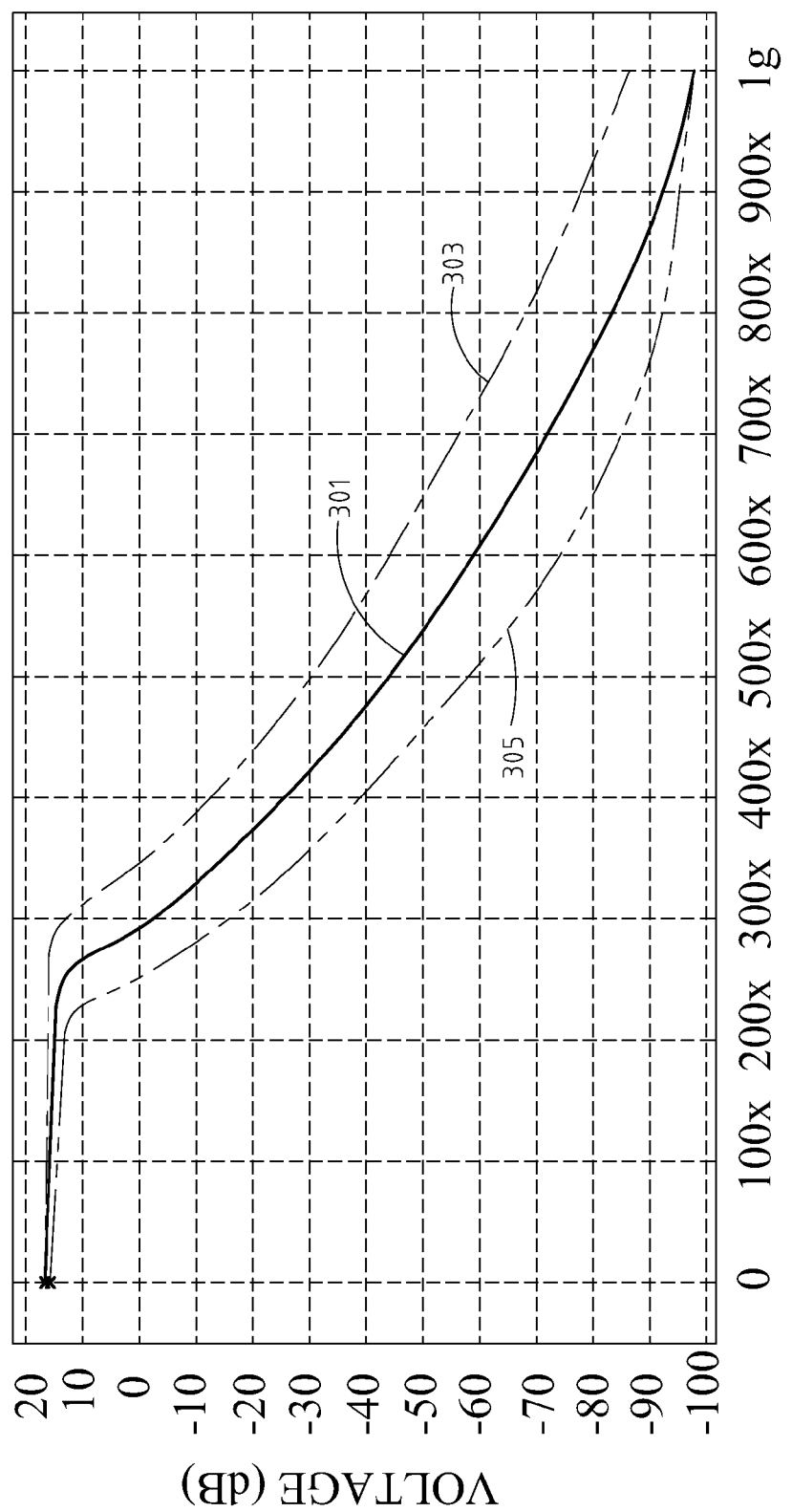
FIG. 3B shows the frequency response variation caused by manufacturing variations of a conventional filter.
Figure 4:
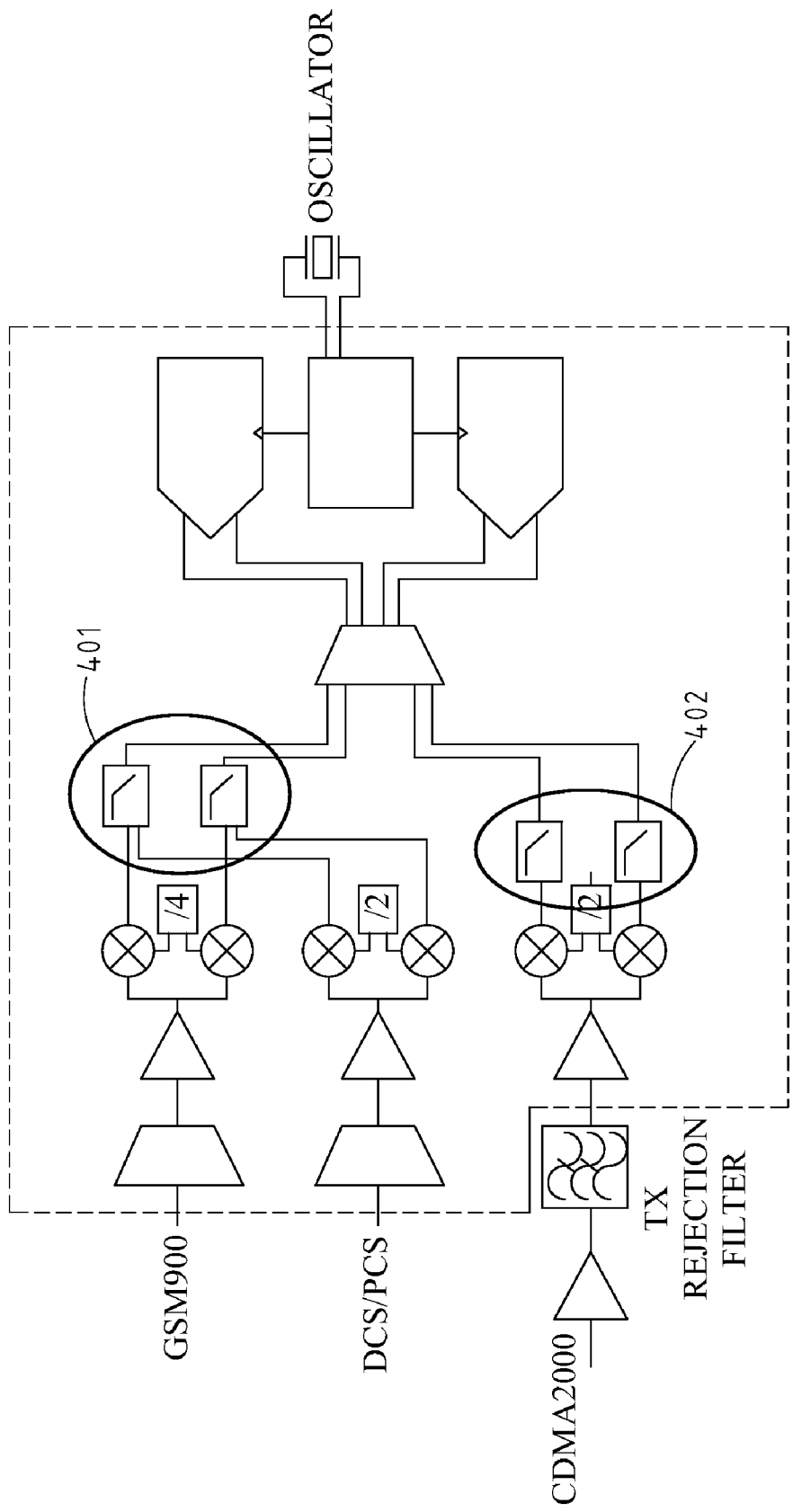
FIG. 4 shows a system block diagram of a conventional dual-standard RF sub-system.
Figure 5:
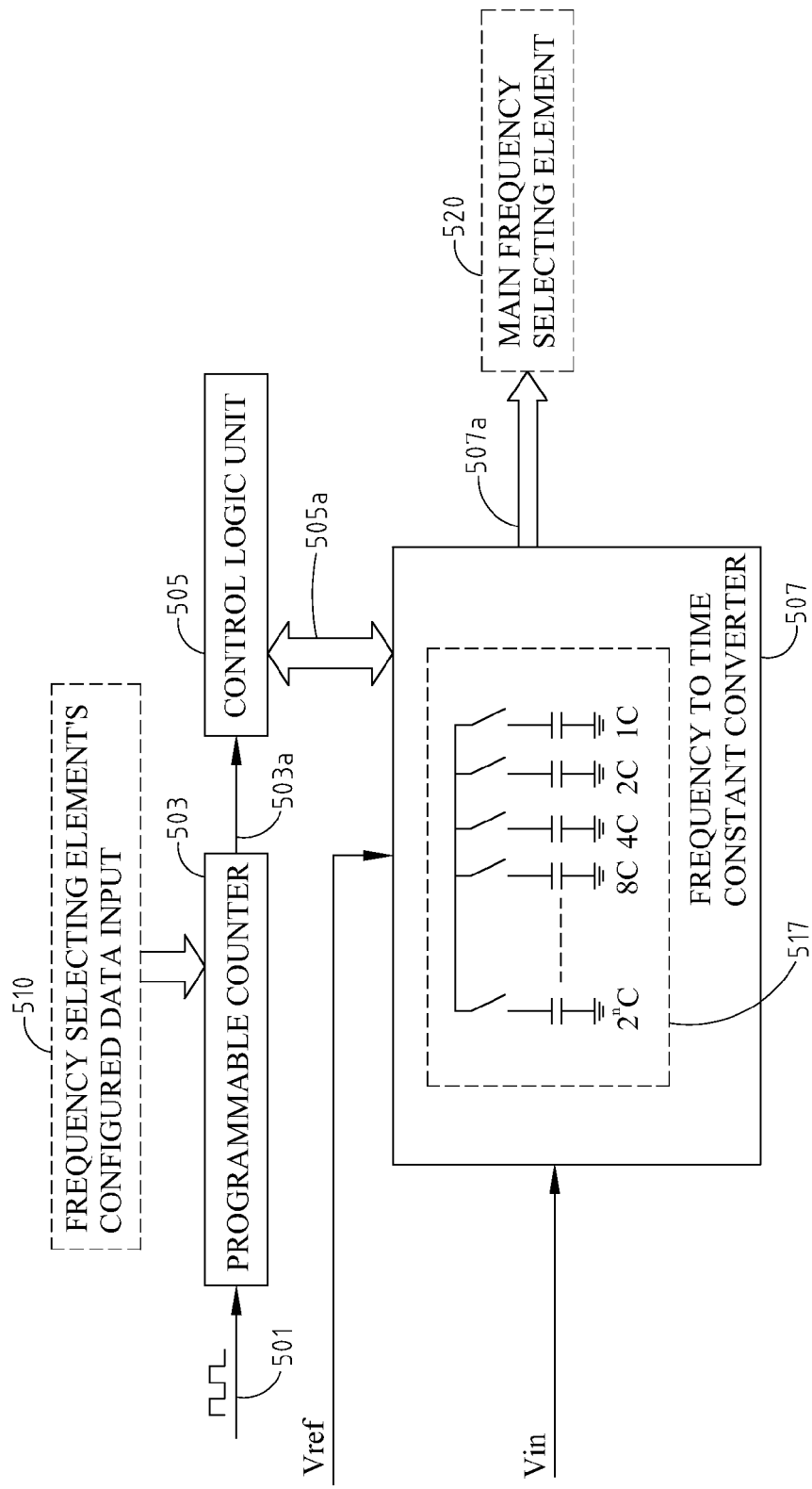
FIG. 5 shows a schematic view of a calibration apparatus for programmable response frequency selecting elements of the present invention.

With the analysis of the problems encountered in using and design the frequency selecting elements in conventional systems, the present invention may meet the demands of single-chip multi-standard system to provide different configured frequency selecting elements with different frequency response for different communication units through the same circuit with programmability. FIG. 5 shows a schematic view of a calibration apparatus for programmable response frequency selecting elements of the present invention.

As shown in FIG. 5, the calibration apparatus for programmable response frequency selecting elements comprises at least a basic reference source 501, a programmable counter 503, a logic control unit 505, and a frequency to time constant converter 507. The frequency to time constant converter 507 further includes a capacitor set 517, i.e., capacitors 1C, 2C, 4C, ..., $2^n$ C.

According to the frequency selecting element's configured data input 510, the programmable counter 503 uses input basic reference source 501 to generate different frequency signals 503a in a programmable manner. The control logic unit 505, based on different frequency signals 503a, generates a plurality of timing control signals 505a to control the timing sequence of the charging and discharging of the frequency to time constant converter 507. The frequency to time constant converter 507 uses timing control signals 505a, a reference voltage Vref and an input voltage Vin to tune capacitors 1C, 2C, 4C, ..., 2n C and determines a calibrated capacitance 507a. The capacitance 507a may be directly outputted to an external main frequency selecting element 520, thereby accomplishing the frequency calibration and response tuning of the frequency selecting element.

Therefore, the present disclosure allows the frequency selecting element to have a digital interface to input different frequency response for frequency calibration and response tuning so that the frequency selecting element may configure the response of the frequency selecting element, and accomplish the frequency calibration and response tuning for the frequency selecting element.

It is worth noting that that calibrated capacitance may be directly outputted to other related time constant selecting elements, or frequency selecting elements to provide higher precision calibration and programmability. The frequency selecting elements may be filters, oscillators, and so on.

The calibration apparatus for programmable response frequency selecting elements of the present invention requires a basic reference source independent of the process, temperature and power supply variations in order to overcome the above variations. In general, the electronic system uses a crystal (XTAL) oscillator to generate the reference source because the XTAL oscillator is a precise time reference source. Therefore, basic reference source 501 can use the XTAL oscillator of the electronic system to provide input to programmable counter 503 to save the cost. Basic reference source is a fixed frequency reference source.

When the frequency selecting element requires a different frequency response, a different reference source is required for the calibration and compensation. Based on the frequency selecting element's configured data input, the programmable counter 503 generates different reference sources through programmability by using an input fixed reference source to accomplish the indirect change of the frequency response for different frequency selecting elements. The programmable response mechanism of the present invention comes from the programmable counter 503. In other words, no additional frequency source is required. The programmable counter 503 can meet the demands of different frequency selecting elements with different frequency response for requiring different reference sources for calibration and compensation.

According to the present invention, the frequency to time constant converter 507 uses a plurality of timing control signals to control the charge and discharge timing, and selects a calibrated capacitance from the capacitors $1C, 2C, 4C, \ldots, 2^n C$. The calibrated capacitance is directly outputted to the capacitor set of the main frequency selecting element, and accomplishes the frequency calibration and response tuning of the frequency selecting element.

Figure 6:
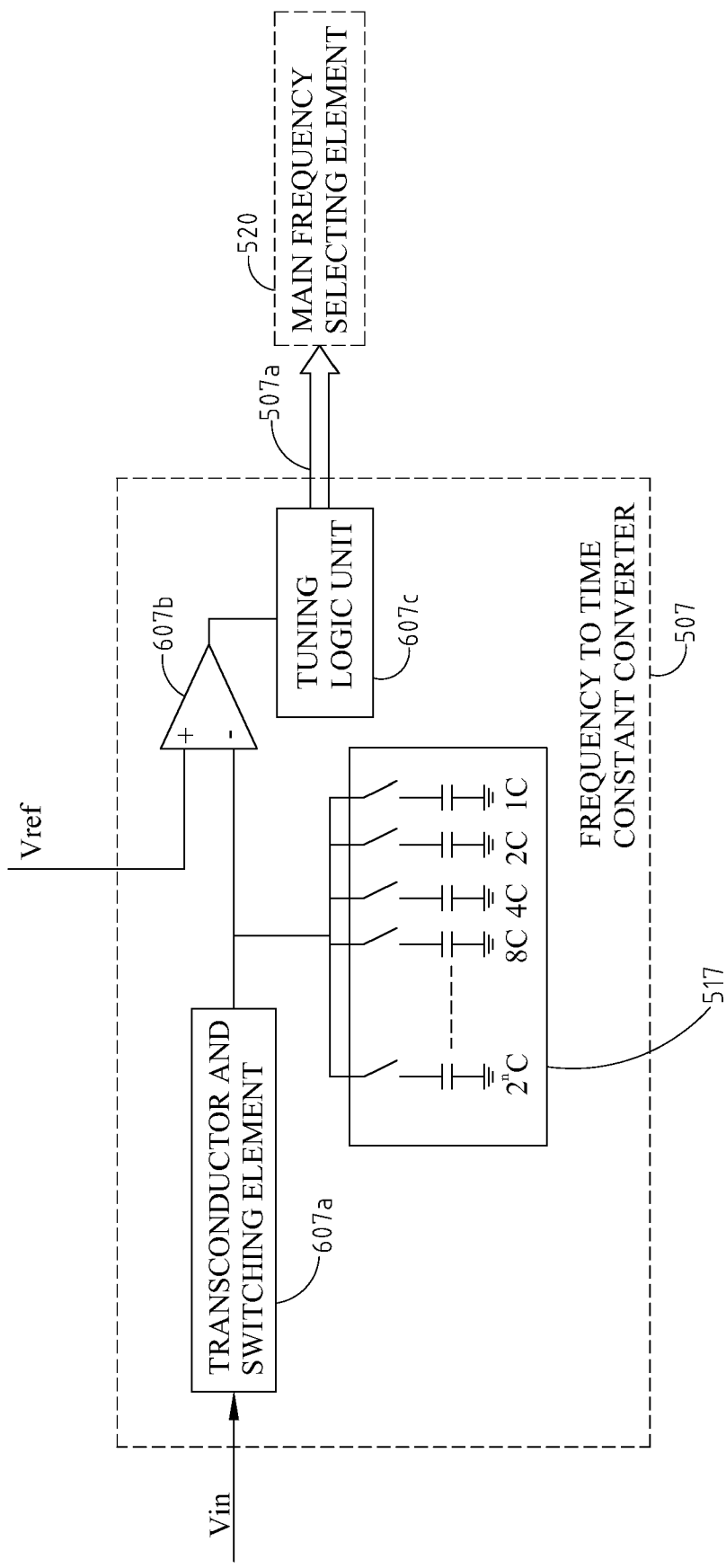
FIG. 6 shows a working example of implementing the frequency to time constant converter of FIG. 5.

FIG. 6 uses an example to describe the internal structure and operation of the frequency to time constant converter of the present invention.

As shown in FIG. 6, the frequency to time constant converter 507 further includes a transconductor and switching element 607a, a capacitor set 517, i.e., capacitors $1C, 2C, 4C, \ldots, 2^n C$, a comparator 607b, and a tuning logic unit 607c. The transconductor and switching element 607a receives an input voltage Vin, and charges and discharges the capacitor set 517 sequentially. The comparator 607b compares the input reference voltage Vref with the voltage of capacitor set 517. After the comparison, the tuning logic unit 607c determines whether each capacitor of capacitor set 517 can be enabled. Therefore, the comparison with the voltage of all capacitors $1C, 2C, 4C, \ldots, 2^n C$ in the frequency to time constant converter 507 is completed, and the calibrated capacitance is obtained.

Figure 7:
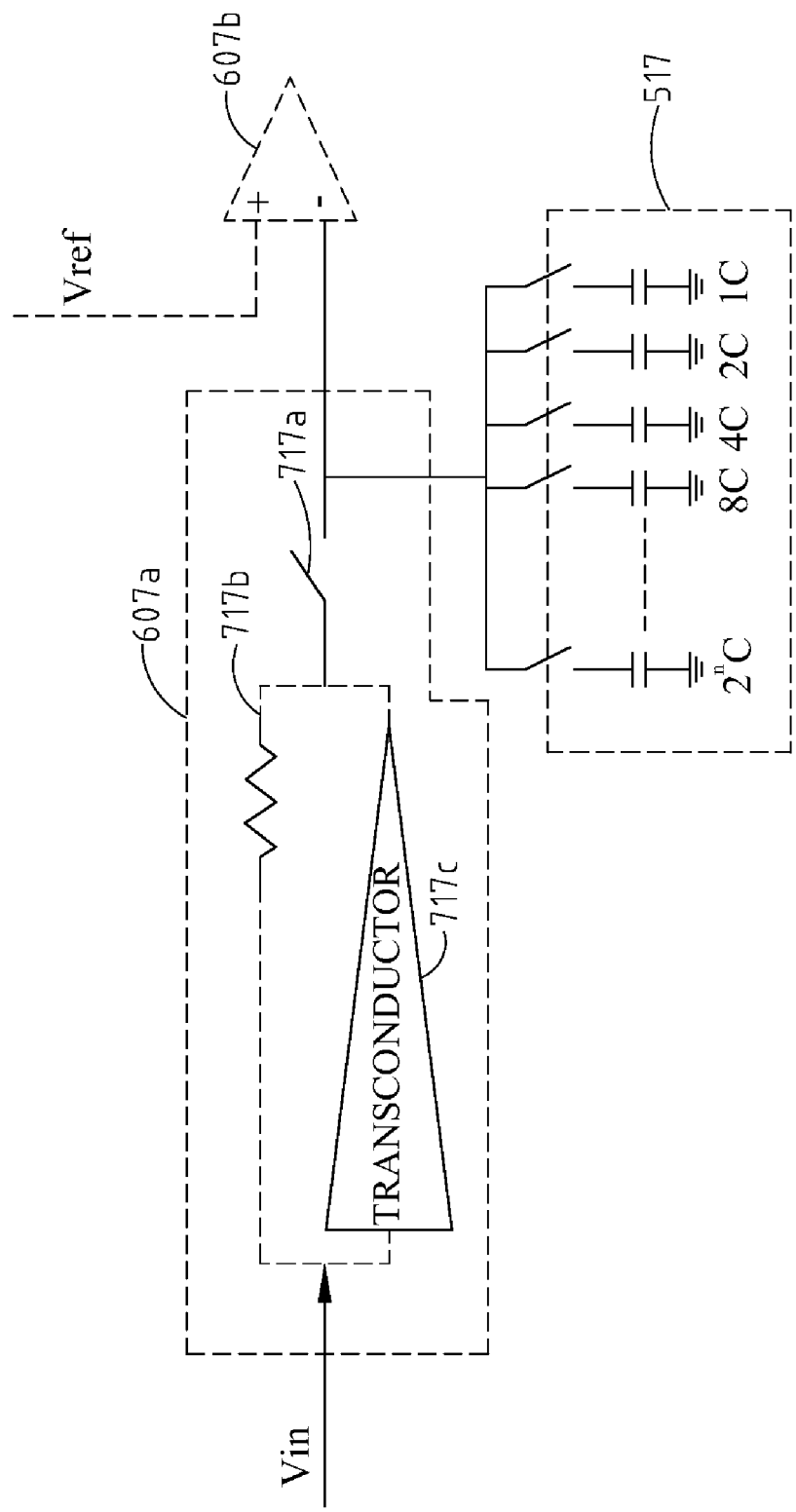
FIG. 7 shows a working example of implementing the transconductor and switching element of FIG. 6.

There are many ways to implement the transconductor and switching element 607a. To satisfy the different specifications of the frequency selecting elements, including both continuous time type and discrete time type frequency selecting elements, a preferred working example is shown in FIG. 7. The transconductor and switching element 607a further includes a switch 717a, and a resistor 717b or a transconductor 717c. The input voltage Vin charges and discharges each capacitors of the capacitor set 517 sequentially through the control of switch 717a.

Except the analog comparator in the frequency to time constant converter, all the other elements of the present disclosure are low speed and high reliability digital logic circuit. Therefore, the chip area required to implement the disclosure is small, and no additional factors affecting the yield rate exist. Because the circuit design is simple, the additional power consumption is also low.

Figure 8:
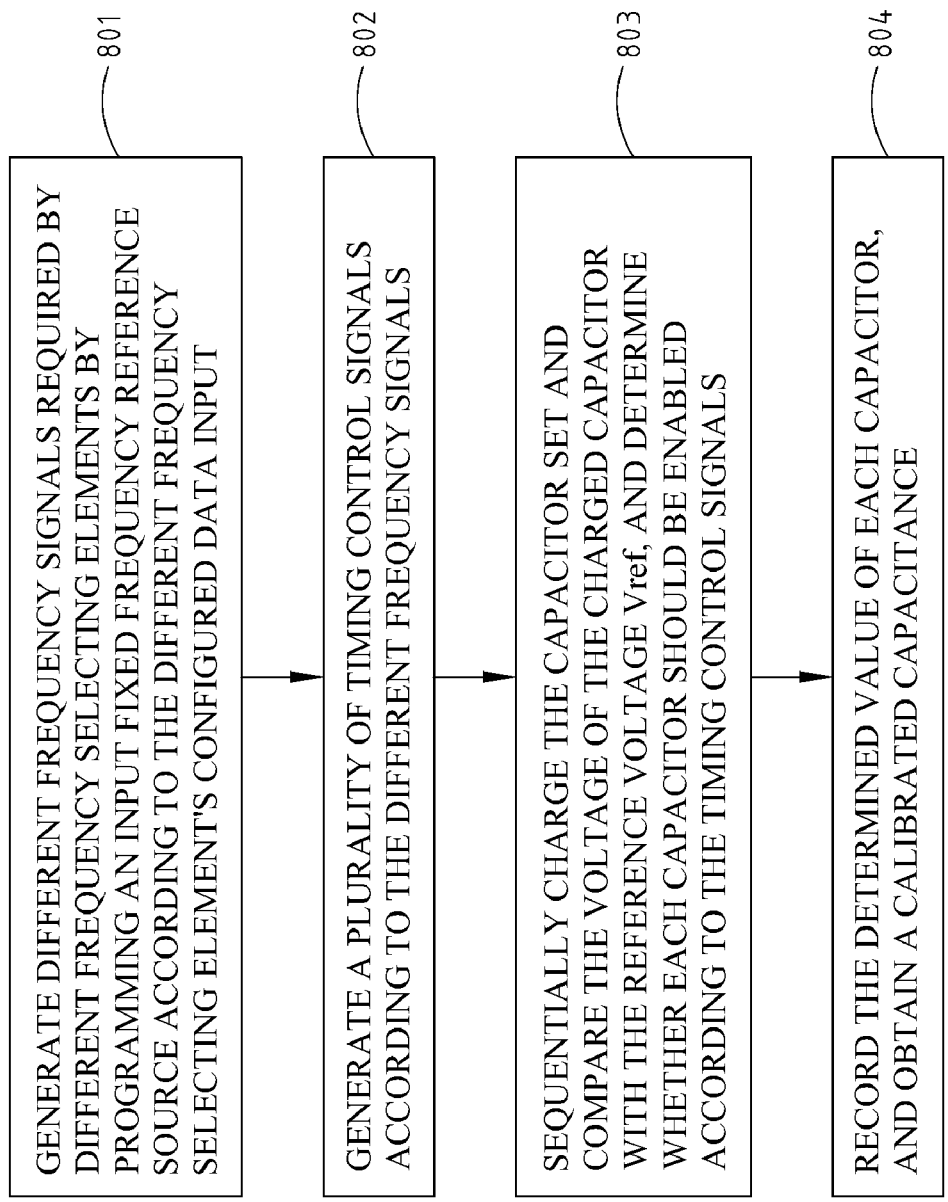
FIG. 8 shows a flowchart illustrating the calibration method of the present invention.

FIG. 8 shows a flowchart illustrating the calibration method for programmable response frequency selecting elements of the present invention. When an electronic system is under one of the conditions, such as being switched on, being reset, being idle and so on, step 801 is to generate different frequency signals required by different frequency selecting elements by programming an input fixed frequency reference source according to the different frequency selecting element's configured data input. Step 802 is to generate a plurality of timing control signals according to the different frequency signals. Step 803 is to sequentially charge the capacitor set and compare the voltage of the charged capacitor with the reference voltage Vref, and determine whether each capacitor should be enabled according to the timing control signals. Step 804 is to record the determined value of each capacitor, and obtain a calibrated capacitance.

The calibrated capacitance can be seen as a multi-bit vector, where each bit indicates whether the corresponding capacitor $1C, 2C, 4C, \ldots, 2^n C$ is enabled. The calibrated capacitance may be directly outputted to the capacitor set of the main frequency selecting element to accomplish the frequency calibration and response tuning of the frequency selecting element.

It is worth noting that the calibration apparatus for programmable response frequency selecting elements of the present invention operates when the system is under the conditions, such as being switched on, being reset, being idle, and so on. Therefore, it does not require other interface for setting. In other words, the frequency calibration and response tuning of the frequency selecting element is executed and accomplished when the electronic system is switched on or reset or idle. Therefore, no further frequency calibration or response tuning is required during the operation of the system, and no operating pulse of additional digital circuit will become a system interference source.

In summary, the calibration apparatus and method for programmable response frequency selecting elements of the present invention is applicable to the multi-standard application to provide precise, stable, and high tuning range of the frequency response. Furthermore, the present invention may maintain the design specification to overcome the variations on process, temperature and power supply. In the multi-standard applications, the present invention may greatly reduce the chip area as well as the cost. The present invention can also provide a digital interface to the frequency selecting elements for configuring the frequency response so that the frequency selecting elements may input different frequency responses.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A calibration apparatus for programmable response frequency selecting elements, comprising:
    a basic reference source;
    a programmable counter, for generating different frequency signals required by different frequency selecting elements by programming said basic reference source according to said different frequency selecting elements' configured data input;
    a control logic unit, for generating a plurality of timing control signals according to said different frequency signals; and
    a frequency to time constant converter including a capacitor set having a plurality of capacitors, said frequency to time constant converter receiving said timing control signals, tuning said capacitor set according to a reference voltage and an input voltage, and determining a calibrated capacitance;
    wherein said frequency to time constant converter further includes:
    a transconductor and switching element, for receiving said input voltage, and sequentially charging and discharging said capacitor set;
    a comparator, for comparing the voltage of said charged capacitor set with said reference voltage; and
    a tuning logic unit, for determining whether each capacitor of said capacitor set is enabled after said comparison.

2. The calibration apparatus as claimed in claim 1, wherein said basic reference source is a fixed frequency reference source.

3. The calibrated apparatus as claimed in claim 2, wherein said basic reference source is a reference source generated by a crystal oscillator.

4. The calibration apparatus as claimed in claim 1, wherein said plurality of timing control signals control the timing of charging and discharging said capacitor set.

5. The calibration apparatus as claimed in claim 1, wherein said calibrated capacitance is a multi-bit vector, with each bit indicating whether a corresponding capacitor of said capacitor set is enabled.

6. The calibrated apparatus as claimed in claim 1, wherein said calibrated capacitance is directly outputted to an external main filter.

7. The calibrated apparatus as claimed in claim 1, wherein said transconductor and switching element further includes a switch, and one of a resistor or a transconductor.

8. The calibrated apparatus as claimed in claim 7, wherein said input voltage sequentially charges and discharges each said capacitor of said capacitor set through the control of said switch.

9. The calibrated apparatus as claimed in claim 1, wherein said different frequency selecting elements include at least one discrete time filter.

10. The calibrated apparatus as claimed in claim 1, wherein said different frequency selecting elements include at least one continuous time filter.

11. The calibrated apparatus as claimed in claim 1, wherein said calibrated capacitance is directly outputted to one of a time constant selecting related element and a frequency selecting related element.

12. The calibrated apparatus as claimed in claim 1, wherein one of said different frequency selecting elements is an oscillator.

* * * * *